United States Patent [19]
Fujisawa et al.

[11] 3,944,937
[45] Mar. 16, 1976

[54] BROAD-BAND SIGNAL TRANSMITTING DEVICE USING TRANSFORMER

[75] Inventors: Seiji Fujisawa, Ikoma; Toru Michioka, Itami, both of Japan

[73] Assignee: Matsushita Electric Industrial Co., Ltd., Osaka, Japan

[22] Filed: Dec. 3, 1974

[21] Appl. No.: 529,101

[30] Foreign Application Priority Data

Mar. 15, 1974 Japan.............................. 49-30354
Dec. 6, 1973 Japan........................ 48-140398[U]
May 2, 1974 Japan........................... 49-50212[U]
June 6, 1974 Japan.......................... 49-65607[U]

[52] U.S. Cl. ..................... 328/167; 333/14; 333/18
[51] Int. Cl.²............................................. H04B 1/10
[58] Field of Search .......... 333/17, 14, 18; 328/165, 328/167, 240

[56] References Cited
UNITED STATES PATENTS

| | | | |
|---|---|---|---|
| 2,931,901 | 4/1960 | Markusen ............................ | 328/167 |
| 3,505,607 | 4/1970 | Van Gerwen et al................ | 328/167 |
| 3,562,675 | 2/1971 | Urell..................................... | 333/17 |

*Primary Examiner*—John S. Heyman
*Attorney, Agent, or Firm*—Stevens, Davis, Miller & Mosher

[57] ABSTRACT

A broad-band signal transmitting device including a signal transmitting transformer of the primary to secondary turn ratio 1 : N, comprising a first circuit for expanding the transmission band to low frequencies by decreasing the impedance as well as by decreasing the gain for the signal component in the primary circuit of the transmission transformer, a second circuit connected with the output side of the transmission transformer having an impedance larger than $N^2$ times of the impedance of the primary side and smaller than the impedance exhibited by the stray capacitance of the secondary side at the upper limit of the transmission band, an amplifier for recovering the gain drop in the first circuit, and a low frequency compensating circuit for compensating the lack of low frequency transmission characteristic due to the transmission transformer.

9 Claims, 17 Drawing Figures

BROAD-BAND SIGNAL TRANSMITTING DEVICE USING TRANSFORMER

This invention relates to a broad-band video signal transmitting device using a transformer.

Generally, in transmitting signals with a transformer, higher harmonic distortions may occur due to the non-linearity of the B-H characteristic curve of the magnetic core. Further, hysteresis loss occurs corresponding to the area of the B-H loop. These factors give remarkable influences to the transmission characteristic in low frequency range and the magnitudes of these quantities are both proportional to the applied electric current. Broad-band signal transmittion from several hertz to several megahertz is possible by a transformer itself when the magnetic core material and/or the way of winding are selected. For making such a transformer, however, a large magnetic core having a good frequency characteristic and high magnetic permeability is required. This is not preferable since there are limits, especially in the low frequency range, and the cost becomes high. Generally, when the number of turns is increased in a transformer, the lower frequency characteristics are improved, but the high frequency characteristics become worse due to the effects of stray capacitance in the windings.

It can be considered for decreasing distortions in the lower frequency range and thereby improving the low frequency transmission characteristic of a transformer that the input impedance is made small and also the input signal level is decreased to use the transmission transformer in a range where no magnetic saturation occurs in the magnetic core. On the other hand, for expanding the transmission frequency range to higher frequencies, the output impedance of the transmission transformer may be increased sufficiently high, in which case a peak may appear in the transmission frequency characteristic. Further, if the primary and the secondary windings have no common ground potential, another problem arises that noise components due to the stray capacitance between the primary and the secondary windings may be mixed into the output to decrease the S/N ratio.

An object of this invention is, therefore, to provide a signal transmitting device of broad transmission band adapted for transmitting video signals.

Another object of this invention is to provide a signal transmitting device of broad transmission band, having no common ground potential for the input side and the output side, but having excellent S/N ratio without the use of an expensive and heavy transmission transformer having a large magnetic core of high magnetic permeability.

A further object of this invention is to provide a signal transmiting transformer structure adapted for such broad band transmission.

According to this invention, there is provided a broad-band signal transmitting device at least comprising a transmission transformer, a circuit provided on the input side of the transmission transformer for expanding the transmission band to lower frequencies, a high impedance circuit provided on the output side of the transmission transformer for extending the transmission band to higher frequencies, a lower frequency compensating circuit for compensating the frequency characteristic which would be insufficient with only the transmission transformer, and an amplifier for recovering the gain decreased in the circuit for extending the transmission band to lower frequencies.

According to an embodiment of this invention, the amplifier is formed of a differential amplifier for removing the noise components mixed in the transmitted signal due to the stray capacitance between the output and the input sides of the transmission transformer and for amplifying the signal components. In this case, it is arranged that the high impedance circuit provided on the output side is adjustable so as to derive noise components of substantially equal amplitude and the same polarity and to derive the transmission signals of substantially equal amplitude and opposite polarity as the output of the transmission transformer.

For example, in a transformer provided with primary and secondary winding insulated from each other, signal appearing at one end of the secondary winding and including noise components and a signal appearing at the other end of the secondary winding and including noise components are amplified differentially by the differential amplifier so as to remove the noise components. Therefore, signal transmission can be done without the need for providing a common ground for the primary and the secondary windings of the transformer.

According to this invention, the input signal level is reduced for improving the transmission characteristic of a transmission transformer in low frequency range and for removing the low frequency distortion, and also a low frequency compensating circuit is added to the output side of the transformer for further lowering the minimum frequency of the transmission band.

In broad-band signal transmission with a transmission transformer, by the provision of a low frequency compensating circuit on the input side of the transformer, the low frequency characteristic and the variation of the input impedance can be improved with a simple impedance element.

Further according to the broad-band transmission transformer of this invention, insulation is inserted betwen layers of the primary and the secondary windings which are wound on a magnetic core in layers and these windings are wound respectively symmetrically with respect to the symmetrical axis which bisects the magnetic path. Thus, the insulation between the primary and the secondary windings is sufficiently ensured and no unbalanced component appears in the output.

Other objects, features and advantages of this invention will become apparent from the following description on the preferred embodiments made in conjunction with the accompanying drawings, in which.

Figure 1:
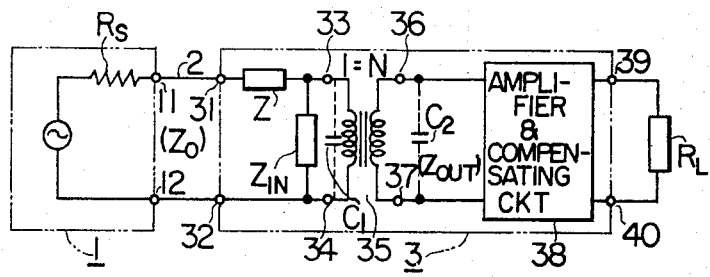
FIG. 1 is a block diagram of an embodiment of the signal transmitting device according to this invention.
Figure 2:
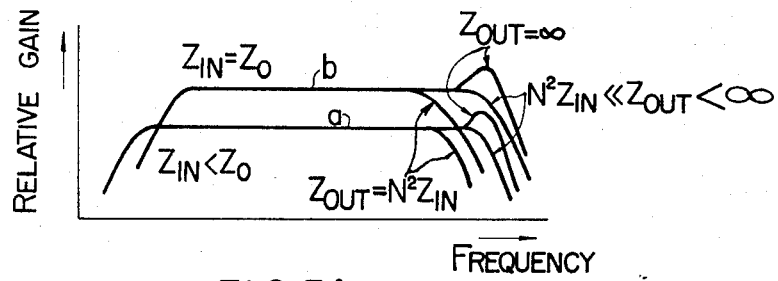
FIG. 2 is a graph showing the improved transmission characteristic of the device shown in FIG. 1.

FIG. 1 is a block diagram of an embodiment of this invention. Namely, in the case where a signal source 1 having an internal resistance $R_s$ matched with the line is connnected between transmitting terminals 11 and 12 of a transmission line 2 of a characteristic impedance $Z_o$ and a load resistance $R_L$ also matched with the line is connected between receiving terminals 31 and 32, as signal transmitting circuit indicated by 3 is inserted in the line. The signal transmitting circuit 3 comprises a video transformer 35 of series resistance Z and turn ratio 1 : 1, a resistance $Z_{in}$ connected between the input side terminals 33 and 34 of the transformer 35, and a low frequency compensating and signal amplifying circuit 38 connected between the output side terminals 36 and 37 of the transformer 35. When the condition $Z_{in} \leq Z_o$ is satisfied, the input signal level for the transformer 35 can be reduced and the minimum frequency of the frequency of the transmission can be lowered. This is illustrated by curves $a$ and $b$ in FIG. 2, in which the curve $a$ represents the transmission characteristic when $Z_{in} > Z_o$ and the curve $b$ when $Z_{in} = Z_o$.

Setting the input impedance of the amplifiying and low frequency compensating circuit 38 seen from the output terminals 36 and 37 of the transmission transformer 35 be $Z_{out}$, the high frequency range is extended when $Z_{out} >> N^2 Z_{in}$. This will be described using the equivalent circuit of the transmitting transformer shown in FIGS. 3A and 3B.

Figure 3A:
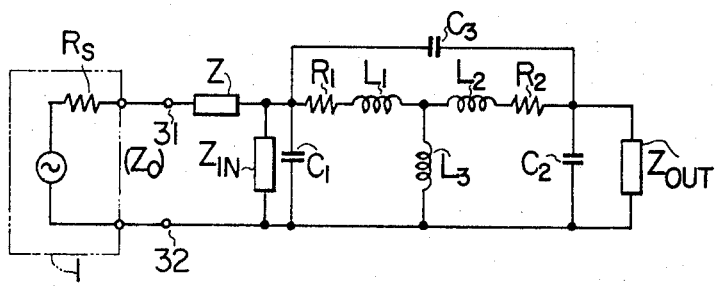
FIG. 3A is an equivalent circuit for the device of FIG. 1.
Figure 3B:
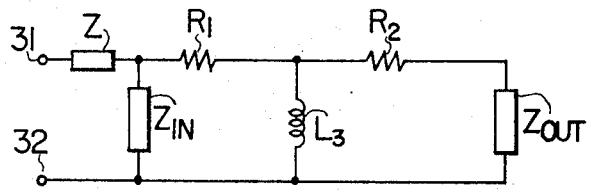
FIG. 3B is another equivalent circuit of the same but in the low frequency range.

FIG. 3A shows an equivalent circuit of the input part and the transformer part of the device of FIG. 1, and FIG. 3B shows an equivalent circuit of the circuit of FIG. 3A only for low frequencies. In the figures, letters $R_1$ and $R_2$ indicate winding resistances of the primary and secondary windings of the transmission transformer 35, $L_1$ and $L_2$ leakage inductances, $L_3$ a parallel inductance, $C_1$ and $C_2$ stray capacitances in the primary and secondary windings, and $C_3$ a stray capacitance between the primary and secondary windings. In the low frequency range, since the quantities $L_1$, $L_2$, $C_1$, $C_2$ and $C_3$ can be neglected, the minimum frequency of transmission is determined by the ratio of the parallel impedance of the impedance exhibited by $L_3$ and $Z_{in}$, from the condition $Z_{in} << z_{out}$ described above and neglecting $R_1$ as can be seen from the equivalent circuit of FIG. 3B. As the frequency decreases, decreases the impedance exhibited by $L_3$. As the result, the frequency characteristic becomes worse at low frequencies. When the impedance $Z_{in}$ is set small, however, the influence of $L_3$ becomes small and the low frequency characteristic is extended. Further, when the impedance $Z_{in}$ is set small, the current flowing through the transformer becomes small and the low frequency distortion due to magnetic saturation of the core is also improved.

With respect to high frequencies, on the other hand, the impedance exhibited by $L_3$ becomes large compared with $Z_{in}$ and can be neglected. Hence, in the equivalent circuit of FIG. 3A, resonance circuit is formed of $L_1$, $L_2$, $C_2$ and $C_3$. Thus, when the impedance $Z_{out}$ is set larger than $Z_{in}$ and smaller than the impedance exhibited by the stray capacitance $C_2$ at the maximum frequency of the used frequency band, the high frequency characteristic is extended.

Description has been made on the extension of the transmission characteristic by the impedances of the input and the output side of the transformer. The gain drop due to the impedances Z and $Z_{in}$ in the circuit of FIGS. 3A and 3B and the insufficient transmission characteristic in the transformer can be recovered in the amplifying and low frequency compensating circuit 38.

Figure 4:
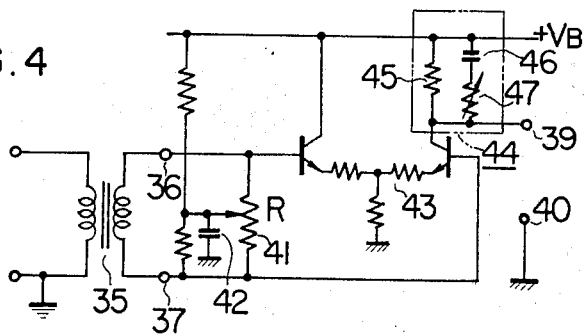
FIG. 4 is a block diagram of a concrete embodiment of the amplifier and low frequency compensating cirsiut shown in FIG. 1.

FIG. 4 shows a concrete embodiment of the amplifying and low frequency compensating circuit 38. When the impedance $Z_{out}$ is increased, the S/N ratio in the high frequency range will become worse. Hence, a resistor 41 having such a resistance R that satisfies the relation $R > N^2 R_{in}$ is connected between the output terminals 36 and 37 of the transmitting transformer 35 and the middle point thereof is grounded through a capacitor 42. Here, N represents the turns ratio of the transformer 35. Then, the signal components derived from both ends of the resistor 41 are of opposite phase. Here, however, with respect to the power source hum existing between the primary side ground and the secondary side ground of the transmission transformer and to various other noise components induced in the power source line, signals of the same polarity are generated at the two ends of the resistor 41. Therefore, when the signals at the two ends of the resistor 41 are applied to a differential amplifier 43, only the true signal components are amplified. Numeral 44 indicates a low frequency compensating circuit comprising a fixed resistor 45, a capacitor 46 for by-passing low frequency components, and a variable resistor 47. Letter +B indicates a dc voltage source and numerals 39 and 40 are singnal output terminals corresponding to the output terminals 39 and 40 of FIG. 1. The operation of the circuit of FIG. 4 will be described referring to the equivalent circuit shown in FIG. 5.

Figure 5:
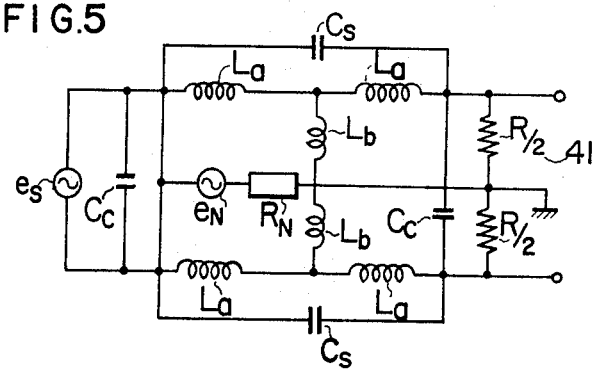
FIG. 5 is an equivalent circuit for the circuit of FIG. 4.

In the equivalent circuit of FIG. 5, the signal component is represented by $e_s$ and the noise components including the power source hum generated between the primary side ground and the secondary side ground of the transmission transformer 35 and various noise induced in the power source line are represented by $e_N$, referring to the secondary side ground as the standard. For simplifying the description, it is assumed that the turn ratio of the transmission transformer is 1 : 1 and that symmetrical way of winding is adapted in which the capacitance between layers of the windings and the distributed capacitance are distributed homogeneously. Letters $L_a$ and $L_b$ indicate leakage inductances and mutual inductances, respectively, from the respective terminals to the middle point of each winding of the transformer. Letter $C_c$ and $C_s$ indicate the capacitances between layers and the stray capacitance between the primary and the secondary windings respectively, and $R_N$ the impedance the respective grounds. (Here, however, the signal source impedance $R_s$ is neglected since $R_s << R_N$.)

As is apparent from this equivalent circuit, quantities $L_a$, $L_b$, $C_c$, $C_s$, etc. become symmetrical with respect to the secondary side ground, and thus the signals appearing at the two terminals of the resistor 41 include noise components $e_N$ of same phase, and signal components $e_s$ of opposite phase. These components are applied to the differential amplifier 43 to derive amplified and low frequency compensated signal component from the output terminals 39 and 40. In the circuit of FIG. 4, the secondary side ground is set at the middle point of the resistor 41. Similar effects, however, can be expected when the ground is set at the middle point of the secondary winding of the transformer 35.

For the validity of the equivalent circuit of FIG. 5, it is required of the transmission transformer 35 that the leakage inductances, the mutual inductances and the capacitances between the layers from the two ends to the middle points of the windings are equal both for the primary and the secondary side and the stray capacitances between the primary and the secondary windings from the respective two ends to the middle point of the windings are equal. FIGS. 6A, 6B and 8A and 10B show structures of the transmission transformer adapted to this invention.

Figure 6A:
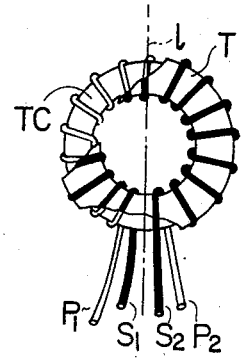
FIGS. 6A and 6B are plan views of a transmission transformer adapted for use in the present signal transmitting device.
Figure 6B:
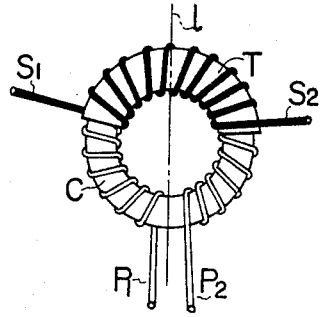

FIGS. 6A and 6B show an embodiment using a toroidal core. In FIG. 6A, a primary winding $P_1-P_2$ and a secondary winding $S_1-S_2$ are wound on a toroidal core TC in such a manner that the number of turns and the distributed capacitance become symmetrical with respect to an axis of symmetry $l$. Then, coupling becomes also symmetrical with respect to the symmetry axis. In this embodiment, the primary winding $P_1-P_2$ is first wound on a magnetic core and then the secondary winding is wound thereon as is illustrated clearly in FIG. 6B. According to such a symmetrical method of winding, is provided a broad-band transformer having no problems in high frequency characteristic and the removal of the noise (in-phase) components.

Figure 7A:
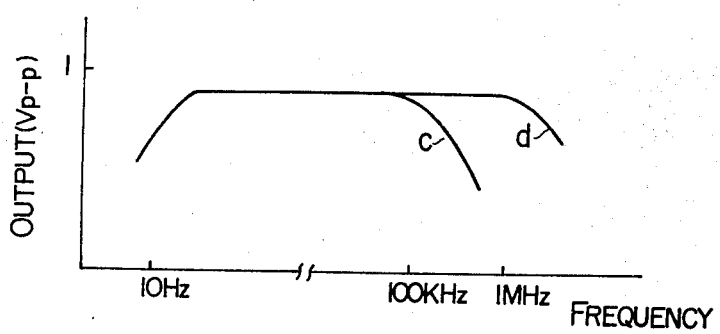
FIG. 7A is a graph showing the transmission characteristic of a transmission transformer having the structure shown in FIGS. 6A and 6B in comparison with that of a conventional transformer.
Figure 7B:
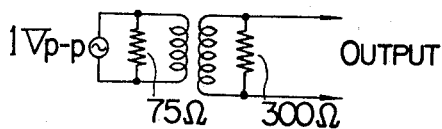
FIG. 7B is a diagram showing a circuit for measuring the transmission characteristic.

Comparison of the transmission frequency characteristic between the conventional split windings and the symmetrical windings of this invention is made in FIG. 7A, in which curve $c$ represents the characteristic of the conventional split windings and curve $d$ the characteristic of the present symmetrical windings. FIG. 7B shows the detection circuit used for measuring the characteristic of FIG. 7A. The signal source generates the voltage signals 1 $V_{p-p}$.

The magnetic core used in this measurement was made of super-permalloy of 5 % Mo and 79% Ni having dimensions of 0.1mm thickness, 10mm width, 25mm$\phi$ inner diameter and 35mm$\phi$ outer diameter. The diameter of the used wire was 0.1mm$\phi$ and the number of windings was 100. The insulating layer used in this embodiment was a Mylar tape of 180 microns thick.

As is also apparent from the above experimental result, the high frequency characteristic of a transformer largely depends on the coupling between the primary and the secondary windings. In the case where the split winding is adopted, a magnetic core of large magnetic permeability and excellent frequency characteristic for the magnetic permeability is required for keeping flat the high frequency transmission characteristic from the audio frequency range to the mega-hertz range. Then, the transformer becomes expensive. In contrast to the above, according to this invention an excellent transmission characteristic extending to the mega-hertz range can be obtained with an ordinary magnetic core.

Although description has been made only on such transformers of the turn ratio 1 : 1, hereinabove, it is apparent that similar characteristic can be obtained in transformers of turn ratio 1 : N provided that windings are formed symmetrically with respect to the symmetry axis $l$. Further, although the magnetic core in the above embodiment was of ring-shape, completely similar effects can be expecected only if the magnetic core is symmetrical with respect to the symmetry axis $l$ and the primary and the secondary windings are wound thereon respectively in one layer. Such embodiments are shown in FIGS. 8A, 8B, and 9.

Figure 8A:
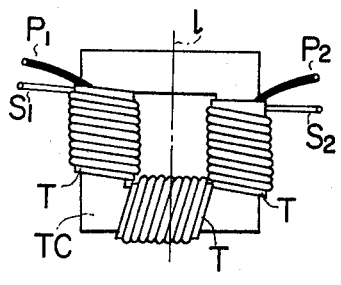
FIGS. 8A and 8B, 9, 10A and 10B are plan views of structures of the transmission transformer adapted for use in the present signal transmitting device.
Figure 8B:
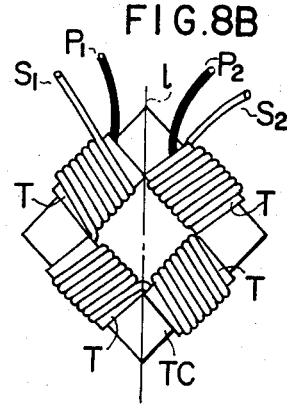
Figure 9:
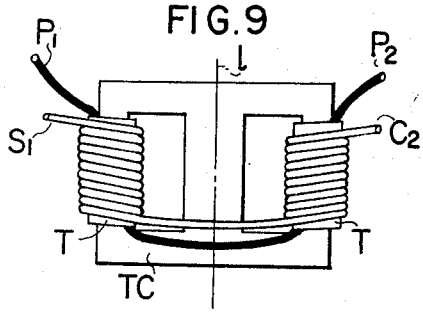

FIGS. 8A and 8B show embodiments of using a square ring core as shown in the figures. In this case, there are two kinds of symmetry axes $l$ and thus two kinds of embodiments can be considered. In either case, the manner of winding is not restricted to that shown in the figure and other ways of winding are possible. Generally, in the case of using polygonal cores, it is only required to wind the primary and the secondary windings symmetrically with respect to the symmetry axis $l$ and respectively in one layer, similar to the case of square-shaped core. Similarly in the case of using a magnetic core having at least one symmetry axis $l$ as shown in FIG. 9, windings can be formed in the same condition with respect to the symmetry axis $l$ and such embodiments as shown in the figure can be thought of. Further, such windings that satisfy the above condition are possible for most magnetic cores of U-shape, pot-shape, etc.

Figure 10A:
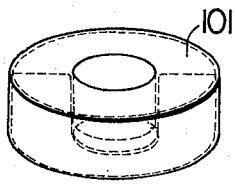
Figure 10B:
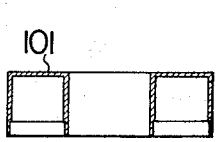
Figure 10B:
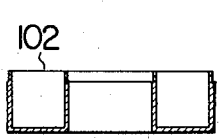

Further, indulating tapes on this molded insulators which give no effects to the coupling between the primary and the secondary windings can be used as the insulating member provided between the primary and the secondary windings. Namely, after a first winding, e.g. the primary winding, is formed on a magnetic core, such an insulating member is disposed thereon to cover the first winding and then a secondary winding is formed thereon. FIGS. 10A and 10B show an embodiment of the insulating member adapted to an annular core. After a first winding is formed on a magnetic core, insulating members divided into two sections 101 and 102 are fitted in face-to-face fashion to contain the magnetic core provided with the first winding therein, and a second winding is formed thereon.

In the embodiment of FIG. 1, the lack of transmission characteristic in the transmission transformer is compensated by a low frequency compensating circuit provided on the secondary side. In contrast to this, an embodiment will be described in which the input impedance seen from the input terminals 33 and 34 of the transformer 35 are made constant with respect to frequency and at the same time compensation in the low frequency region is done. This is done by giving a frequency characteristic to the impedance element $Z_{in}$ connected between the input side terminals of the transformer.

Figure 11:
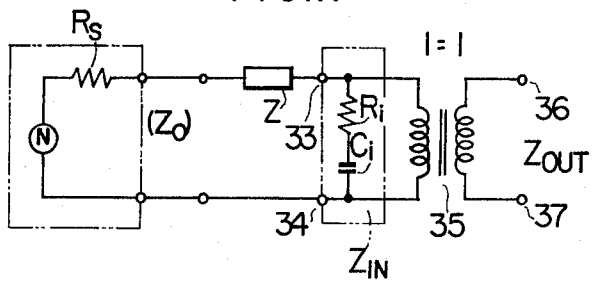
FIG. 11 is a circuit diagram showing the main portion of another embodiment.
Figure 12:
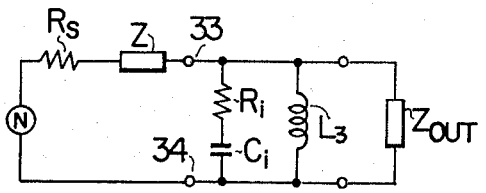
FIG. 12 is an equivalent circuit of the device of FIG. 11 in the low frequency range.

FIG. 11 shows such an embodiment in which the impedance $Z_{in}$ is formed of a series connection of a resistor $R_i$ and a capacitor $C_i$ to afford the function of low frequency compensation. An equivalent circuit of the circuit of FIG. 11 including a transmission transformer in the low frequency range is shown in FIG. 12. The turn ratio of the transformer 35 is assumed to be 1 : 1. The input impedance of the amplifying and low frequency compensating circuit 38 (in this embodiment, the low frequency compensating circuit may be dispensed with) determines the load impedance $Z_{out}$ which is larger than the impedance $R_i$ and smaller than the impedance exhibited by the stray capacitance existing between the output side terminals of the transformer 35 at the maximum frequency of the used frequency range. Thus, in the low frequency range, the low frequency compensating circuit $Z_{in}$ works to en-